United States Patent [19]

Nishimura et al.

[11] Patent Number: 5,171,484
[45] Date of Patent: Dec. 15, 1992

[54] PIEZOELECTRIC CERAMIC COMPOSITION FOR ACTUATOR

[75] Inventors: Tetsuhiko Nishimura, Zama; Yukio Chida; Yasuo Oguri, both of Tokyo, all of Japan

[73] Assignee: Mitsubishi Kasei Corporation, Tokyo, Japan

[21] Appl. No.: 820,321

[22] Filed: Jan. 9, 1992

Related U.S. Application Data

[63] Continuation-in-part of Ser. No. 684,953, filed as PCT/JP90/01180, Sep. 14, 1990, abandoned.

[30] Foreign Application Priority Data

Sep. 18, 1989 [JP] Japan .................................. 1-241149

[51] Int. Cl.$^5$ .............................................. C04B 35/49
[52] U.S. Cl. .................................... 252/62.9; 501/134
[58] Field of Search ...... 501/134; 252/62.9, 62.9 PZT

[56] References Cited

U.S. PATENT DOCUMENTS 3,917,780 11/1975 Mazdiyasni et al. ...... 252/62.9 PZT
3,923,675 12/1975 Mazdiyasni et al. ...... 252/62.9 PZT
4,367,426 1/1983 Kumada et al. .......... 252/62.9 PZT

FOREIGN PATENT DOCUMENTS 0131231 1/1985 European Pat. Off. ... 252/62.9 PZT
2072651 10/1981 United Kingdom ..... 252/62.9 PZT

OTHER PUBLICATIONS

Patent Abstracts of Japan, vol. 011, No. 390 (E-567), Dec. 19, 1987, & JP-A-62-154681, Jul. 9, 1987, K. Kiyoshi et al., "PLZT Electrostrictive Porcelain for Actuator".

Primary Examiner—Karl Group
Assistant Examiner—Anthony J. Green
Attorney, Agent, or Firm—Oblon, Spivak, McClelland, Maier & Neustadt

[57] ABSTRACT

The present invention relates to a piezoelectric ceramic composition for an actuator which is a ceramic composition comprising a main component represented by the formula: $Pb_{(1-x)}La_x[Zr_yTi_{(1-y)}]_{(1-x/4)}O_3$ and, as a sub component, antinomy in an amount of more than 0.05% by weight and less than 3.0% by weight in terms of anitmony pentoxide relative to the main component. The piezoelectric ceramic composition of the present invention has a high electromechanical coupling factor, a high piezoelectric strain constant and a high Curie point, and is particularly excellent as a material for a piezoelectric actuator.

8 Claims, No Drawings

PIEZOELECTRIC CERAMIC COMPOSITION FOR ACTUATOR

This application is continuation-in-part of application Ser. No. 07/684,953 filed as PCT/JP90/01180, Sep. 14, 1990, now abandoned.

TECHNICAL FIELD

The present invention relates to a piezoelectric ceramic composition for an actuator.

Here, the actuator uses a piezoelectric converse effect, i.e. a conversion action from electric energy to mechanical energy. It generates a fine displacement of a micron or submicron order accurately by applying a voltage. It has been rapidly developed in recent years for the applications to precise control of the sound of a buzzer or the flow rate of a pump or a valve, auto tracking or auto focussing of a VTR head, accurate positioning of a mechanical cutting tool at a level of a submicron, and a microscopic positioning device for production of a semiconductor.

BACKGROUND ART

It has been known that as an piezoelectric material for an actuator, lead zirconate titanate ceramic composition (PZT) has excellent piezoelectric properties. Various improvements have been made depending on the use. The properties of the piezoelectric material for an actuator have been improved by, for example, a method wherein a part of lead zirconate titanate is substituted with divalent ions such as $Ba^{2+}$, $Sr^{2+}$ or $Ca^{2+}$ or trivalent ions such as $Bi^{3+}$ or $La^{3+}$, a method wherein an oxide such as $NiO$, $Nb_2O_5$, $MnO_2$ or $Cr_2O_3$ is added, and a method wherein a solid solution with a composite perovskite such as $Pb(Zn_{\frac{1}{3}}Nb_{\frac{2}{3}})O_3$, $Pb(Co_{\frac{1}{3}}Nb_{\frac{2}{3}})O_3$ or $Pb(Ni_{\frac{1}{3}}Nb_{\frac{2}{3}})O_3$ is synthesized. The piezoelectric actuator elements for controlling the fine displacement at a precision of a micron or submicron order include a unimorph type, a bimorph type and a laminated type. Such piezoelectric actuator elements are required to have, as their characteristics, a high piezoelectric strain constant (for example, a piezoelectric strain constant of transversal mode. $d_{31} > 300 \times 10^{-12}$ m/V) and a high Curie point ($Tc > 150°$ C.).

In general, in the case of a material having a high piezoelectric strain constant, the Curie point is low. For example, conventionally, in the case of a material having a high piezoelectric strain constant, of which the piezoelectric strain constant of transversal mode exceeds ($d_{31}$) $300 \times 10^{-12}$ m/V, the Curie point Tc tends to be as low as around 100° C. and the upper limit of the operating temperature of the element is restricted to 50° C. to 60° C., whereby the application as a practical element has been restricted. In the case of a material having a high Curie point, the piezoelectric strain constant tends to be low, and there has been a drawback that high voltage is required to actuate the element. For these reasons, it has been desired to develop a material having a high piezoelectric strain constant, of which the piezoelectric strain constant of transversal mode ($d_{31}$) exceeds $300 \times 10^{-12}$ m/V, and a high Curie point (for example, $Tc > 150°$ C.).

DISCLOSURE OF INVENTION

The present inventors have studied in detail to solve the above-mentioned drawbacks, and, as a result, found that a ceramic composition having a specific composition has all of a high electromechanical coupling factor, a high piezoelectric strain constant and a high Curie point to accomplish the present invention.

That is, the gist of the present invention is a piezoelectric ceramic composition for an actuator which is a ceramic composition comprising lead, lanthanum, zirconium, titanium, antimony and oxygen atoms, and which contains a main component represented by the formula (I):

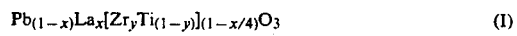

$$Pb_{(1-x)}La_x[Zr_yTi_{(1-y)}]_{(1-x/4)}O_3 \tag{I}$$

wherein $0 < x < 0.08$ and $0.50 < y < 0.65$, and, as a sub component, antimony in an amount of more than 0.05% by weight and less than 3.0% by weight in terms of antimony pentoxide ($Sb_2O_5$) relative to the main component.

BEST MODE FOR CARRYING OUT THE INVENTION

The present invention will be described in detail hereinbelow.

The piezoelectric ceramic composition of the present invention has a very high piezoelectric strain constant and a high Curie point. Particularly, the composition around the phase boundary (MPB=morphotropic phase boundary) of the perovskite crystals within the range of $0.05 \leq x \leq 0.07$ in the above formula (I) has a piezoelectric strain constant of transversal mode ($d_{31}$) exceeding $300 \times 10^{-12}$ m/V and also a Curie point (Tc) of not less than 150° C. Such a composition can overcome the above-mentioned drawbacks, and is very preferable as a material for a piezoelectric actuator.

In the formula (I), a preferable range as the composition of the present invention is $0.02 \leq x \leq 0.07$, particularly preferably $0.05 \leq x \leq 0.07$, and $0.52 \leq y \leq 0.60$, particularly preferably $0.56 \leq y \leq 0.60$. The amount of $Sb_2O_5$ is preferably more than 0.05% by weight and not more than 2.5% by weight, particularly preferably more than 0.05% by weight and not more than 1.0% by weight.

Further, a composition satisfying $0.05 \leq x \leq 0.07$ and $0.56 \leq y \leq 0.60$ in the formula (I) and having an amount of $Sb_2O_5$ of more than 0.05% by weight and not more than 1.0% by weight is preferable because it provides a piezoelectric ceramic composition for an actuator, of which the piezoelectric strain constant of transversal mode ($d_{31}$) exceeds $300 \times 10^{-12}$ m/V. Particularly, a composition satisfying $0.05 \leq x \leq 0.06$ and $0.56 \leq y$ 0.58 and having an amount of $Sb_2O_5$ of more than 0.05% by weight and not more than 1.0% by weight provides a value of the piezoelectric strain constant of transversal mode ($d_{31}$) exceeding $300 \times 10^{-12}$ m/V, and provides a piezoelectric ceramic composition for an actuator whose Curie point (Tc) is not less than 200° C. Also, a composition satisfying $0.06 \leq x \leq 0.07$ and $0.58 \leq y \leq 0.60$ and having an amount of $Sb_2O_5$ of more than 0.05% by weight and not more than 1.0% by weight provides a piezoelectric ceramic composition for an actuator which provides a piezoelectric strain constant of transversal mode ($d_{31}$) exceeding $370 \times 10^{-12}$ m/V. The proportional range of the composition can be determined depending on the respective objects of use.

Among them, a composition in which $x=0.05$ and $y=0.57$ in the formula (I) and the amount of $Sb_2O_5$ is 1.0% by weight; a composition in which $x=0.05$ and $y=0.56$, and the amount of $Sb_2O_5$ is 1.0% by weight; a composition in which $x=0.06$ and $y=0.58$, and the amount of $Sb_2O_5$ is 0.5% by weight; a composition in which x=0.06 and y =0.58, and the amount of $Sb_2O_5$ is 0.1% by weight; and a composition in which x=0.06 and y=0.58, and the amount of $Sb_2O_5$ is 0.2% by weight (Examples 5, 6, 7, 10 and 11) have piezoelectric strain constant of transversal mode ($d_{31}$) exceeding $300 \times 10^{-12}$ m/V and Curie points (Tc) of not less than 200° C., and thus have an advantage that these can be used in a wide range of temperature conditions as a material for a piezoelectric actuator Further, a composition in which x=0.06 and y=0.58 and the amount of $Sb_2O_5$ is 1.0% by weight; and a composition in which x=0.07, y=0.60 and the amount of $Sb_2O_5$ is 0.5% by weight (Examples 8 and 9) have piezoelectric strain constant of transversal mode ($d_{31}$) exceeding 370 $10^{-12}$ m/V and Curie points (Tc) exceeding 150° C., and thus are very excellent as a material for a piezoelectric actuator.

Here, when x is not less than 0.08 in the formula (I), Curie point (Tc) is not more than 150° C. and the piezoelectric strain constant of transversal mode ($d_{31}$) is so small that it can not be detected by a resonance-antiresonance method, and thus such a composition is not suitable as a material for a piezoelectric actuator Also, in the case where y is not more than 0.50 and the case where y is not less than 0.65, the Zr/Ti ratio deviates from the phase boundary of the perovskite crystal to a great extent and thus the piezoelectric strain constant of transversal mode ($d_{31}$) tends to be low. In the case where the amount of Sb is not less than 3.0% by weight in terms of $Sb_2O_5$ (Comparative Example 5), a pirochlore phase as well as a perovskite phase is included in a sintered material, whereby the piezoelectric strain constant of transversal mode ($d_{31}$) tends to be low such being undesirable. In the case where the amount of Sb is not more than 0.05% by weight in terms of $Sb_2O_5$, the effect for improvement of the piezoelectric strain constant of transversal mode by the addition of Sb tends to be inadequate.

The piezoelectric ceramic composition of the present invention can be obtained by, for example, weighing powdery oxide materials to obtain a predetermined blend composition, wet mixing it by a ball mill, calcinating, grinding and sintering at 1,100° C. to 1,300° C.

The additional amount of antimony is represented by an amount in term of $Sb_2O_5$, but antimoxy may be added by using antimony compounds such as antimony trioxide ($Sb_2O_3$) of the corresponding amount other than $Sb_2O_5$.

Now, the present invention will be described in more detail with reference to Examples However, it should be understood that the present invention is by no means restricted to the Examples so long as it is not beyond the gist of the present invention.

EXAMPLES 1 to 11 and COMPARATIVE EXAMPLES 1 to 6

PbO, $La_2O_3$, $ZrO_2$ and $TiO_2$ which are highly pure oxide starting materials each having a purity of not less than 99.9% are weighed in the proportions as shown in Table 1, and $Sb_2O_5$ was weighed in the amount as shown in Table 1 relative to the main component. Here, the values of x and y in the formula (I) are as shown in Table 1. These starting materials were wet-mixed for 24 hours by means of a ball mill. After drying and molding treatments, calcination at 900° C. was conducted for 2 hours, and then grinding in a mortar was conducted, followed by wet-grinding again for 24 hours by means of a ball mill. After the powder thus obtained was subjected to hydrostatic pressure molding by a rubber press method, sintering was conducted at 1,200° C. in a lead atmosphere The resultant sintered material was worked into a disclike or rod-like shape by means of a slicing machine, and then subjected to screen printing with a silver paste and electrode baking at 550° C. Polarization treatment was conducted in silicone oil at a temperature of from 80 to 110° C. under an electric field intensity of from 2.0 to 3.0 kV/mm for 5 to 20 hours. After one day had passed, respective piezoelectric properties of a dielectric constant ($\epsilon_{33}^{T}/\epsilon_0$) at 1 kHz, a dielectric loss (tan $\epsilon$) at 1 kHz, an electromechanical coupling factor of transversal mode ($K_{31}$), an elastic compliance ($S_{11}^{E}$) and a piezoelectric strain constant of transversal mode ($d_{31}$) were measured by means of a vector impedance analyzer by a resonance-antiresonance method. Also, Curie point (Tc) was obtained by measuring the thermal properties of a relative dielectric constant and determining from the maximum of the relative dielectric constant The results of the measurements are shown in Table 2.

TABLE 1

| | Starting materials for the main component (Molar fraction) | | | | | | $Sb_2O_5$ amount (% by weight) |
|---|---|---|---|---|---|---|---|
| | PbO | $La_2O_3$ | $ZrO_2$ | $TiO_2$ | x | y | |
| Example 1 | 0.98 | 0.01 | 0.52 | 0.48 | 0.02 | 0.52 | 2.0 |
| Example 2 | 0.98 | 0.01 | 0.52 | 0.48 | 0.02 | 0.52 | 2.5 |
| Example 3 | 0.97 | 0.015 | 0.53 | 0.47 | 0.03 | 0.53 | 2.0 |
| Example 4 | 0.96 | 0.02 | 0.53 | 0.46 | 0.04 | 0.54 | 1.5 |
| Example 5 | 0.95 | 0.025 | 0.56 | 0.42 | 0.05 | 0.57 | 1.0 |
| Example 6 | 0.95 | 0.025 | 0.55 | 0.43 | 0.05 | 0.56 | 1.0 |
| Example 7 | 0.94 | 0.03 | 0.57 | 0.41 | 0.06 | 0.58 | 0.5 |
| Example 8 | 0.94 | 0.03 | 0.57 | 0.41 | 0.06 | 0.58 | 1.0 |
| Example 9 | 0.93 | 0.035 | 0.59 | 0.39 | 0.07 | 0.60 | 0.5 |
| Example 10 | 0.94 | 0.03 | 0.57 | 0.41 | 0.06 | 0.58 | 0.1 |
| Example 11 | 0.94 | 0.03 | 0.57 | 0.41 | 0.06 | 0.58 | 0.2 |
| Comparative Example 1 | 0.96 | 0.02 | 0.55 | 0.44 | 0.04 | 0.56 | 0 |
| Comparative Example 2 | 0.95 | 0.025 | 0.56 | 0.42 | 0.05 | 0.57 | 0 |
| Comparative Example 3 | 0.94 | 0.03 | 0.57 | 0.41 | 0.06 | 0.58 | 0 |
| Comparative Example 4 | 0.93 | 0.035 | 0.59 | 0.39 | 0.07 | 0.60 | 0 |
| Comparative Example 5 | 0.98 | 0.01 | 0.52 | 0.48 | 0.02 | 0.52 | 3.0 |
| Comparative Example 6 | 0.92 | 0.04 | 0.62 | 0.36 | 0.08 | 0.63 | 0.5 |

TABLE 2

| | Sintered density (g/cm³) | $\epsilon_{33}^{T}/\epsilon_0$ | tan δ | $K_{31}$ | $S_{11}^{E}$ ($\times 10^{-11}$ m²/N) | $d_{31}$ ($\times 10^{-12}$ m/V) | Tc (°C.) |
|---|---|---|---|---|---|---|---|
| Example 1 | 7.81 | 2460 | 0.016 | 0.405 | 1.530 | 233 | 282 |
| Example 2 | 7.79 | 2620 | 0.016 | 0.395 | 1.521 | 235 | 261 |
| Example 3 | 7.82 | 3005 | 0.017 | 0.425 | 1.591 | 276 | 252 |
| Example 4 | 7.79 | 3260 | 0.017 | 0.415 | 1.610 | 283 | 238 |

TABLE 2-continued

| | Sintered density (g/cm³) | $\epsilon_{33}^T/\epsilon_o$ | tan δ | $K_{31}$ | $S_{11}^E$ (× $10^{-11}$ m²/N) | $d_{31}$ (× $10^{-12}$ m/V) | Tc (°C.) |
|---|---|---|---|---|---|---|---|
| Example 5 | 7.81 | 4830 | 0.021 | 0.412 | 1.670 | 348 | 222 |
| Example 6 | 7.80 | 3610 | 0.022 | 0.440 | 1.660 | 321 | 220 |
| Example 7 | 7.81 | 4180 | 0.021 | 0.443 | 1.650 | 346 | 200 |
| Example 8 | 7.79 | 4807 | 0.021 | 0.455 | 1.680 | 385 | 183 |
| Example 9 | 7.77 | 5820 | 0.023 | 0.417 | 1.590 | 377 | 162 |
| Example 10 | 7.80 | 3850 | 0.022 | 0.425 | 1.580 | 312 | 216 |
| Example 11 | 7.81 | 4030 | 0.022 | 0.430 | 1.610 | 326 | 211 |
| Comparative Example 1 | 7.77 | 1669 | 0.022 | 0.394 | 1.444 | 182 | 282 |
| Comparative Example 2 | 7.72 | 2320 | 0.023 | 0.386 | 1.495 | 214 | 254 |
| Comparative Example 3 | 7.74 | 3620 | 0.025 | 0.419 | 1.511 | 291 | 221 |
| Comparative Example 4 | 7.75 | 4305 | 0.027 | 0.361 | 1.497 | 273 | 172 |
| Comparative Example 5 | 7.80 | Measurement was not conducted because of the presence of a pirochlore phase. | | | | — | — |
| Comparative Example 6 | 7.77 | No resonance peak | | | | 0 | 104 |

INDUSTRIAL APPLICABILITY

The piezoelectric ceramic composition obtained by the present invention has a high electromechanical coupling factor, a high piezoelectric strain constant and a high Curie point and is particularly excellent as a material for a piezoelectric actuator. The contribution of the present invention to the industrial applications is extremely large.

We claim:

1. A piezoelectric ceramic composition for an actuator which is a ceramic composition comprising lead, lanthanum, zirconium, titanium, antimony and oxygen atoms, and which contains a main component represented by the formula (I):

$$Pb_{(1-x)}La_x[Zr_yTi_{(1-y)}]_{(1-x/4)}O_3 \qquad (I)$$

wherein $0<x<0.08$ and $0.50<y<0.65$, and, as a sub component, antimony in an amount of more than 0.05% by weight and less than 3.0% by weight in terms of antimony pentoxide relative to the main component.

2. The piezoelectric ceramic composition for an actuator according to claim 1, wherein, in the formula (1), x and y are $0.02 \leq x \leq 0.07$ and $0.52 \leq y \leq 0.60$.

3. The piezoelectric ceramic composition for an actuator according to claim 1, wherein the composition contains antimony in an amount of more than 0.05% by weight and not more than 2.5% by weight in terms of antimony pentoxide relative to the main component.

4. The piezoelectric ceramic composition for an actuator according to claim 1, wherein, in the formula (I), x and y are $0.05 \leq x \leq 0.07$ and $0.56 \leq y \leq 0.60$.

5. The piezoelectric ceramic composition for an actuator according to claim 1, wherein the composition contains antimony in an amount of more than 0.05% by weight and not more than 1.0% by weight in terms of antimony pentoxide relative to the main component.

6. The piezoelectric ceramic composition for an actuator according to claim 1, wherein, in the formula (I), x and y are $0.02 \leq x \leq 0.07$ and $0.52 \leq y \leq 0.60$, and the composition contains antimony in an amount of more than 0.05% by weight and not more than 1.0% by weight in terms of antimony pentoxide relative to the main component.

7. The piezoelectric ceramic composition for an actuator according to claim 1, wherein, in the formula (I), x and y are $0.05 \leq x \leq 0.06$ and $0.56 \leq y \leq 0.58$, and the composition contains antimony in an amount of more than 0.05% by weight and not more than 1.0% by weight in terms of antimony pentoxide relative to the main component.

8. The piezoelectric ceramic composition for an actuator according to claim 1, wherein, in the formula (I), x and y are $0.06 \leq x \leq 0.07$ and $0.56 \leq y \leq 0.60$, and the composition contains antimony in an amount of more than 0.05% by weight and not more than 1.0% by weight in terms of antimony pentoxide relative to the main component.

* * * * *